(12) United States Patent
Park et al.

(10) Patent No.: US 9,520,838 B2
(45) Date of Patent: Dec. 13, 2016

(54) INVERTER TYPE POWER AMPLIFIER

(71) Applicant: SOONGSIL UNIVERSITY RESEARCH CONSORTIUM TECHNO-PARK, Seoul (KR)

(72) Inventors: Jong Hoon Park, Seoul (KR); Chang Hyun Lee, Seoul (KR); Chang Kun Park, Suwon-si (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 14/836,972

(22) Filed: Aug. 27, 2015

(65) Prior Publication Data

US 2016/0065153 A1    Mar. 3, 2016

(30) Foreign Application Priority Data

Sep. 1, 2014    (KR) .................. 10-2014-0115450

(51) Int. Cl.
| | |
|---|---|
| *H03F 3/26* | (2006.01) |
| *H03F 1/34* | (2006.01) |
| *H03F 1/22* | (2006.01) |
| *H03F 3/195* | (2006.01) |
| *H03F 3/24* | (2006.01) |
| *H03F 3/30* | (2006.01) |

(52) U.S. Cl.
CPC .............. *H03F 1/342* (2013.01); *H03F 1/223* (2013.01); *H03F 3/195* (2013.01); *H03F 3/245* (2013.01); *H03F 3/3028* (2013.01); *H03F 2200/408* (2013.01); *H03F 2200/411* (2013.01); *H03F 2203/30031* (2013.01)

(58) Field of Classification Search
CPC .............. H03F 1/34; H03F 1/342; H03F 3/26; H03F 3/68
USPC .................. 330/277, 291, 265, 310
See application file for complete search history.

(56) References Cited

U.S. PATENT DOCUMENTS 2,987,681 A * 6/1961 Buck ................. H02M 7/53846
327/535
6,737,924 B1 * 5/2004 Paillet ..................... H03F 1/083
330/264
2007/0145961 A1 6/2007 Hasegawa et al.

FOREIGN PATENT DOCUMENTS

KR    10-2007-0068239 A    6/2007

* cited by examiner

*Primary Examiner* — Steven J Mottola
(74) *Attorney, Agent, or Firm* — Revolution IP, PLLC

(57) ABSTRACT

The present disclosure relates to an inverter type power amplifier. An exemplary embodiment of the present disclosure provides an inverter type power amplifier including: a first transistor including a gate to which an AC type of input signal is applied through an input port, a first terminal connected a power source voltage, and a second terminal connected to an output port; a second transistor including a gate through which the input signal is applied thereto, a first terminal connected to a ground, and a second terminal connected to the output port; a feedback resistor including a first terminal connected to the input port and a second terminal connected to the output port; and an AC blocking block including a first terminal connected to the output port and a second terminal connected to a DC output port.

13 Claims, 5 Drawing Sheets

INVERTER TYPE POWER AMPLIFIER

CROSS-REFERENCE TO RELATED APPLICATION

This application claims priority to and the benefit of Korean Patent Application No. 10-2014-0115450 filed in the Korean Intellectual Property Office on Sep. 1, 2014, the entire contents of which are incorporated herein by reference.

BACKGROUND (a) Field

The present disclosure relates to an inverter type of a power amplifier, and more particularly, to an inverter type of a power amplifier that may generate a self-bias voltage of a direct current (DC) component.

(b) Description of the Related Art

A power amplifier, which is one of circuits which are generally used in a high frequency integrated circuit for a wireless communication system and a hybrid circuit, is used to amplify a signal that is applied thereto. There are many types of power amplifiers, and an inverter type power amplifier is one of those that are widely used.

FIG. 1 illustrates a schematic circuit diagram of a typical inverter type power amplifier.

As shown in FIG. 1, a typical inverter type power amplifier 100 includes a power source voltage port VDD and ground port GND applying each a power source voltage and a ground, an input port ($RF_{in}$) to which an input signal is inputted, and an output port ($RF_{out}$) from which an output signal is outputted.

Transistors of the typical inverter type power amplifier 100 may include a PMOS 110 and a NMOS 120. A drain of the PMOS 110 is connected to the output port ($RF_{out}$), a gate of the PMOS 110 is connected to the input port ($RF_{in}$), and a source of the PMOS 110 is connected to the power source voltage port VDD. A drain of the NMOS 120 is connected to the output port ($RF_{out}$), a gate of the NMOS 120 is connected to the input port ($RF_{in}$), and a source of the NMOS 120 is connected to the ground port GND.

In addition, a feedback resistor 130 is disposed between the output port and the input port to interconnect the output port and the input port. The feedback resistor has a relatively great resistance so that transmission of an AC signal is suppressed and only a DC voltage is supplied, thereby applying a bias voltage to the PMOS 110 and the NMOS 120. If the PMOS 110 and the NMOS 120 have the same performance, a outputted DC voltage of the output port is a voltage of VDD/2. That is, a DC voltage of the output port is determined depending on performance of the PMOS 110 and NMOS 120.

FIG. 2 illustrates a schematic circuit diagram of an inverter type power amplifier according to the conventional art.

As shown in FIG. 2, a DC blocking block 231 interconnecting a gate of a PMOS 210 and the input port and a DC blocking block 232 interconnecting a gate of a NMOS 220 and the input port are further formed in the power amplifier shown in FIG. 1. Further, DC power sources 251 and 252 are respectively formed at the gate sides of the PMOS 210 and the NMOS 220 so that DC voltages are respectively supplied to the PMOS 210 and the NMOS 220, and AC blocking blocks 241 and 242 are respectively formed between the gate of the PMOS 210 and the DC power source 251 and between the gate of the NMOS 220 and the DC power source 252 so as to prevent an AC signal form being leaked to the DC power source.

It is preferable to suppress a through-current that the DC power source 251 substantially supplies about a threshold voltage of the PMOS 210 and the DC power source 252 substantially supplies about a threshold voltage of the NMOS 220. As such, when the voltages of the DC power sources 251 and 252 are adjusted, since a period in which the PMOS 210 and the NMOS 220 are simultaneously turned on can be adjusted, a through current can be adjusted. However, in this case, since an additional DC power source is added, a circuit and a system are complexified.

Background technology of the present disclosure is disclosed at Korean Patent Laid-Open Publication No. 2007-0068239 (Jun. 29, 2007).

The above information disclosed in this Background section is only to enhance the understanding of the background of the disclosure and therefore it may contain information that does not form the prior art that is already known in this country to a person of ordinary skill in the art.

SUMMARY

The present disclosure has been made in an effort to provide an inverter type power amplifier that can generate a self-bias voltage.

An exemplary embodiment of the present disclosure provides an inverter type power amplifier including: a first transistor including a gate to which an AC type of input signal is applied through an input port, a first terminal connected a power source voltage, and a second terminal connected to an output port; a second transistor including a gate through which the input signal is applied thereto, a first terminal connected to a ground, and a second terminal connected to the output port; a feedback resistor including a first terminal connected to the input port and a second terminal connected to the output port; and an AC blocking block including a first terminal connected to the output port and a second terminal connected to a DC output port.

Another exemplary embodiment of the present disclosure provides An inverter type power amplifier including: a first transistor including a gate to which an AC type of input signal is applied through an input port, a first terminal connected a power source voltage, and a second terminal connected to an output port; a second transistor including a gate through which the input signal is applied thereto, a first terminal connected to a ground, and a second terminal connected to the output port; a feedback resistor including a first terminal connected to the input port and a second terminal connected to the output port; and an AC blocking block including a first terminal connected to the input port and a second terminal connected to a DC output port.

The output port may be connected a DC blocking block.

The AC blocking block may be connected to a gate of a third transistor through the DC output port.

The inverter type power amplifiers may be connected in series in two or more stages.

The AC blocking block may be formed of a resistor.

The first transistor may be a p-type MOSFET, the second transistor may be a n-type MOSFET, the first terminal of each of the first transistor and the second transistor may be a source, and the second terminal of each of the first transistor and the second transistor may be a drain.

The first transistor may be a PNP-type BJT, the second transistor may be a NPN-type BJT, the first terminal of each of the first transistor and the second transistor may be an emitter, and the second terminal of each of the first transistor and the second transistor may be a collector.

According to the exemplary embodiments of the present disclosure, the self-bias can be generated without any additional bias circuit, thereby simplifying the entire system. Further, since power consumed by the bias circuit decreases, energy efficiency of the entire system may increase.

DETAILED DESCRIPTION OF THE EMBODIMENTS

Figure 1:
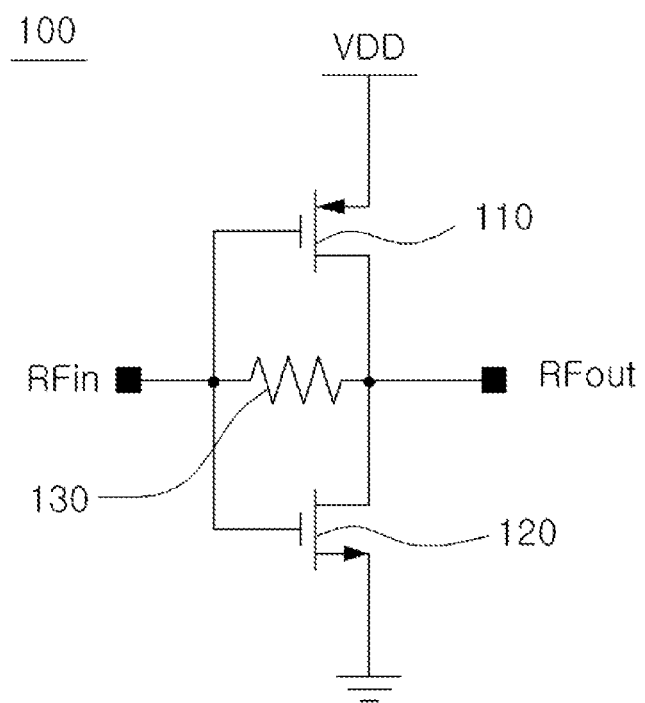
FIG. 1 illustrates a schematic circuit diagram of a typical inverter type power amplifier.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure. Parts that are irrelevant to the description will be omitted to clearly describe the present disclosure, and the same or similar constituent elements will be designated by the same reference numerals throughout the specification.

Throughout this specification and the claims that follow, when it is described that an element is "coupled" to another element, the element may be "directly coupled" to the other element or "indirectly coupled" to the other element through a third element. In addition, unless explicitly described to the contrary, the word "comprise" and variations such as "comprises" or "comprising" will be understood to imply the inclusion of stated elements but not the exclusion of any other elements, and are not intended to preclude the possibility that one or more other features, numbers, steps, actions, components, parts, or combinations thereof may exist or may be added.

Exemplary embodiments will now be described in detail with reference to FIGS. 3 to 6. For ease of description, a metal oxide semiconductor field effect transistor (MOSFET) is taken as an example of a transistor. However, the MOSFET is only one example, and thus other transistors such as a bipolar junction transistor (BJT) and the like may be used.

Figure 3:
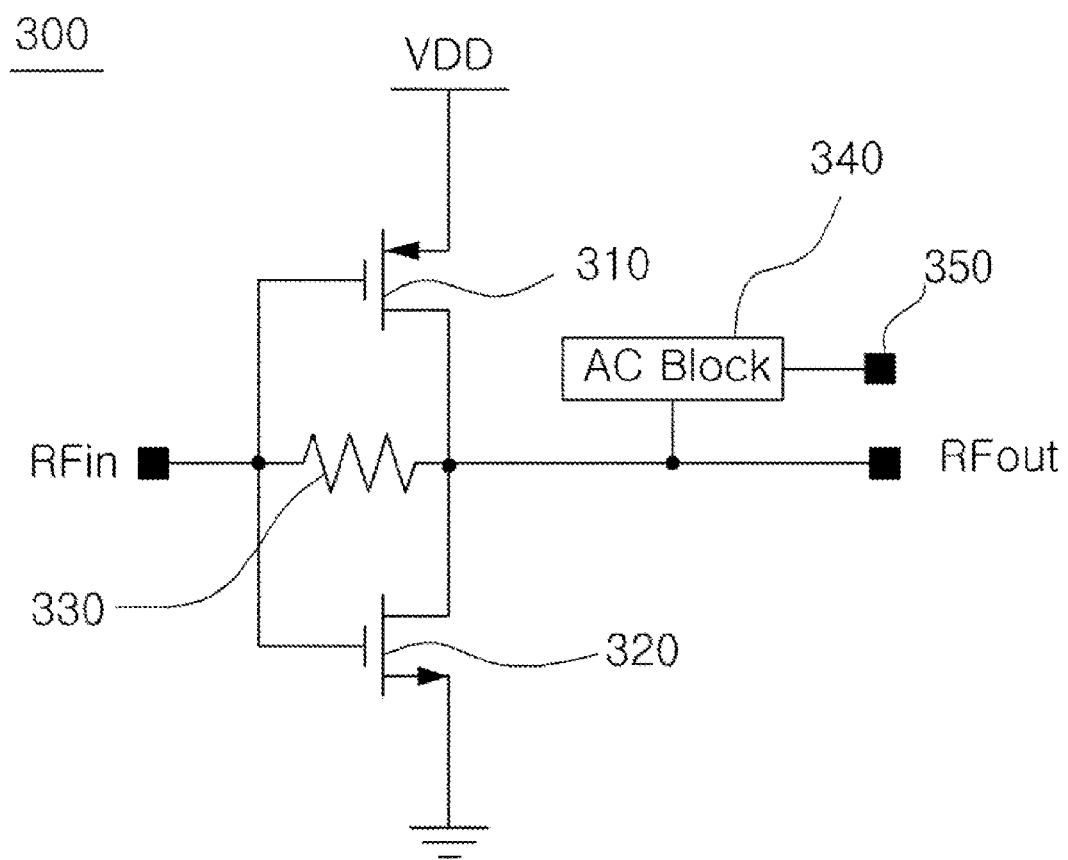
FIG. 3 illustrates a schematic circuit diagram of an inverter type power amplifier according to an exemplary embodiment of the present disclosure.

FIG. 3 illustrates a schematic circuit diagram of an inverter type power amplifier according to an exemplary embodiment of the disclosure.

As shown in FIG. 3, an inverter type power amplifier 300 according to an exemplary embodiment of the present disclosure includes a first transistor 310, a second transistor 320, a feedback resistor 330, and an AC blocking block 340.

An AC type of input signal is applied to a gate of the first transistor 310 through the input port ($RF_{in}$), a source of the first transistor 310 is connected to the power source voltage VDD, and a drain of the first transistor 310 is connected to the output port ($RF_{out}$). The input signal of the second transistor 320 is applied through a gate thereof, a source of the second transistor 320 is connected to a ground, and a drain of the second transistor 320 is connected to the output port ($RF_{out}$). A first terminal of the feedback resistor 330 is connected to the input port, and a second terminal of the feedback resistor 330 is connected to the output port.

In the inverter type power amplifier 300 according to the exemplary embodiment of the present disclosure, when a high signal is applied through the input port ($RF_{in}$), the second transistor 320 is turned on, the first transistor 310 is turned off, and a low signal is outputted from the output port ($RF_{out}$). In contrast, when a low signal is applied through the input port (RFin), the first transistor 310 is turned on, the second transistor 320 is turned off, and a high signal is outputted from the output port ($RF_{out}$).

A first terminal of the AC blocking block 340 is connected to the second terminal of the feedback resistor 330, and the second terminal of the AC blocking block 340 is connected to the DC output port 350. Since the AC blocking block 340 blocks an AC component and passes a DC component, only the DC component is outputted from the DC output port 350. Accordingly, when the AC blocking block 340 is connected to a port to which a bias voltage of a power amplifier is required, it is possible to generate a DC component of self-bias without an additional bias circuit.

As shown in FIG. 3, when an AC current is applied to the input port ($RF_{in}$), a DC component as well as an AC component is outputted from the output port ($RF_{out}$) due to the component of the feedback resistor 330. In this case, only the DC component may be outputted from the DC output port 350 by removing the AC component through the AC blocking block 340.

In an inverter type power amplifier according to another exemplary embodiment of the present disclosure, the AC blocking block 340 may be connected to the input port ($RF_{in}$) instead of the output port ($RF_{out}$). That is, the first terminal of the AC blocking block 340 may be connected to the input port ($RF_{in}$), and the second terminal of the AC blocking block 340 may be connected to the DC output port. Among the input port ($RF_{in}$) and the output port ($RF_{out}$), when the AC blocking block 340 is connected to the output port ($RF_{out}$), since drive capability of the power amplifier is excellent, it is more preferable to connect the blocking block 340 to the output port ($RF_{out}$).

In addition, by adjusting a performance ratio between the first transistor 310 and the second transistor 320 when the power amplifier 300 is designed, various DC voltages may be outputted. For example, when a voltage of the VDD is about 4 V in FIG. 3 and the performance of the first transistor 310 and the second transistor 320 are the same, about 2 V, which is a half of the voltage of the VDD, is outputted from the output port. When the performance of the first transistor 310 is superior to the performance of the second transistor 320, a higher voltage than the voltage of VDD/2 is outputted from the output port. Accordingly, the output voltage may be adjusted by adjusting the performance ratio between the first transistor 310 and the second transistor 320.

When the power amplifier 300 is designed, a method of adjusting a length or a width of the gate of the transistor as a method of adjusting the performance ratio may be used. The AC blocking block 340 may be realized by using a high resistor.

Figure 4:
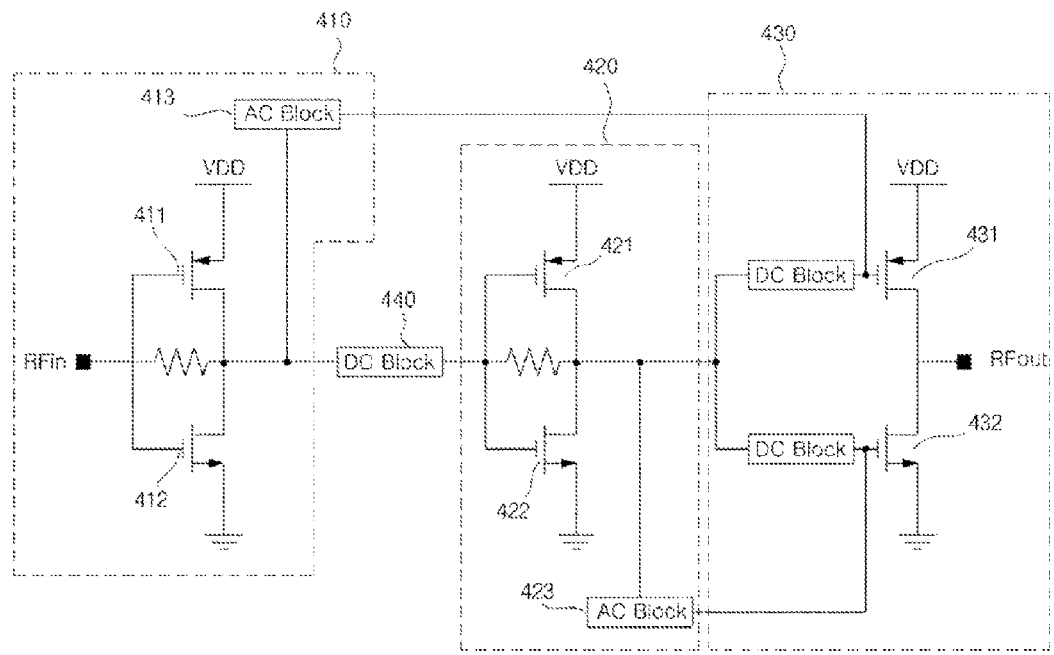
FIG. 4 illustrates a circuit diagram of an expanded exemplary embodiment of FIG. 3.

FIG. 4 illustrates a circuit diagram of an expanded exemplary embodiment of FIG. 3.

According to an exemplary embodiment of FIG. 4, inverter type power amplifiers 410, 420, and 430 are connected in total three stages in series. When the power amplifier is designed, the inverter type power amplifiers are connected in many stages for obtaining a high gain. DC blocking block 440 is connected to separate the DC voltage between the first power amplifier 410 and the second power amplifier 420. A self-bias may be generated by using AC blocking blocks 413 and 423 at the output port of each stage, and a DC component bias voltage may be applied to a gate of a power amplifier connected to a subsequent stage by using the generated self-bias.

Figure 2:
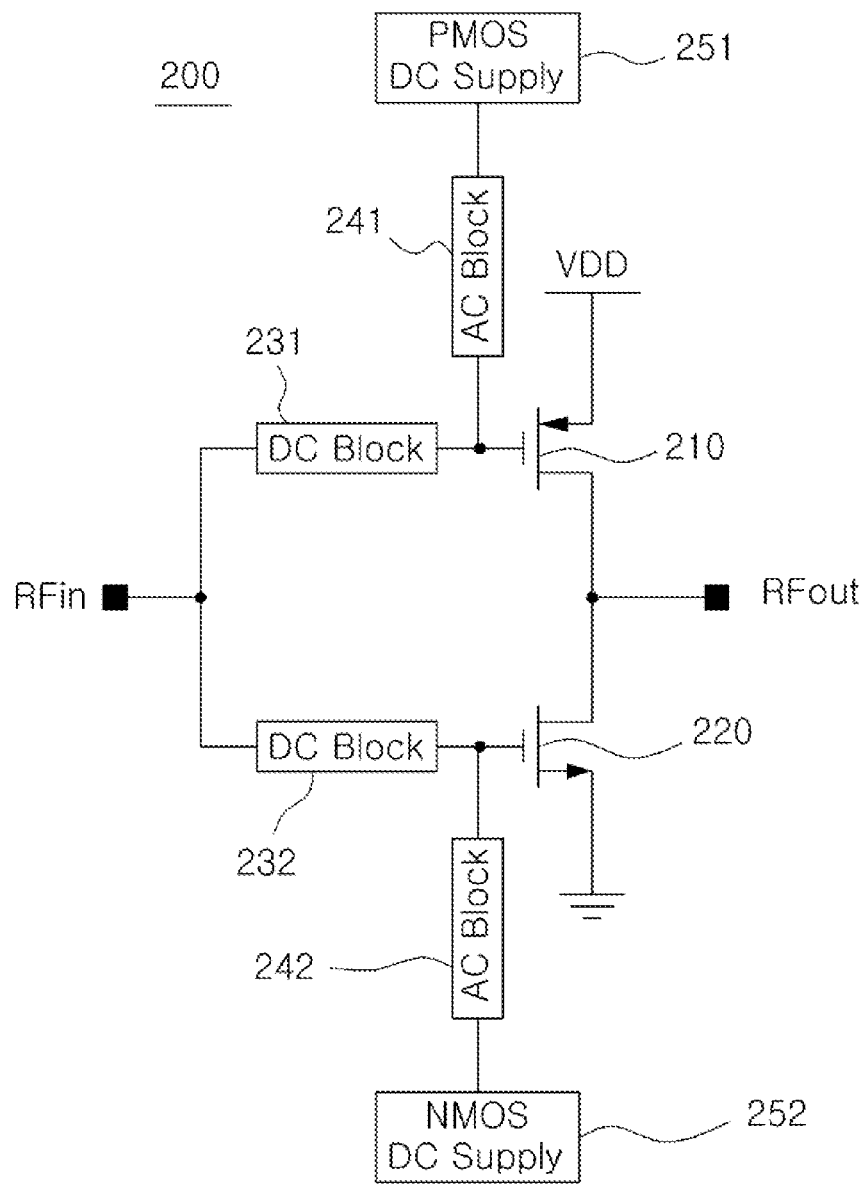
FIG. 2 illustrates a schematic circuit diagram of an inverter type power amplifier according to a conventional art.

Referring to FIG. 4, the DC component bias voltage outputted from the AC blocking block 413 included in the power amplifier 410 of the first stage is applied to the gate of the first transistor 431 included in the power amplifier 430 of the third stage, and the DC component bias voltage outputted from the AC blocking block 423 included in the power amplifier 420 of the second stage is applied to the gate of the second transistor 432. By such a connection, two DC power sources 251 and 252 included in the power amplifier 200 shown in FIG. 2 may be removed, thereby simplifying the circuit.

In the exemplary embodiment shown in FIG. 4, when it is assumed that a higher voltage is applied to the gate of the first transistor 431 than the gate of the second transistor 432 for driving the power amplifier 430, the voltage applied the gate of the first transistor 431 may be designed to be higher than the voltage applied to the gate of the second transistor 432 by using the first transistor 411 having a higher performance than that of the second transistor 422.

Figure 5:
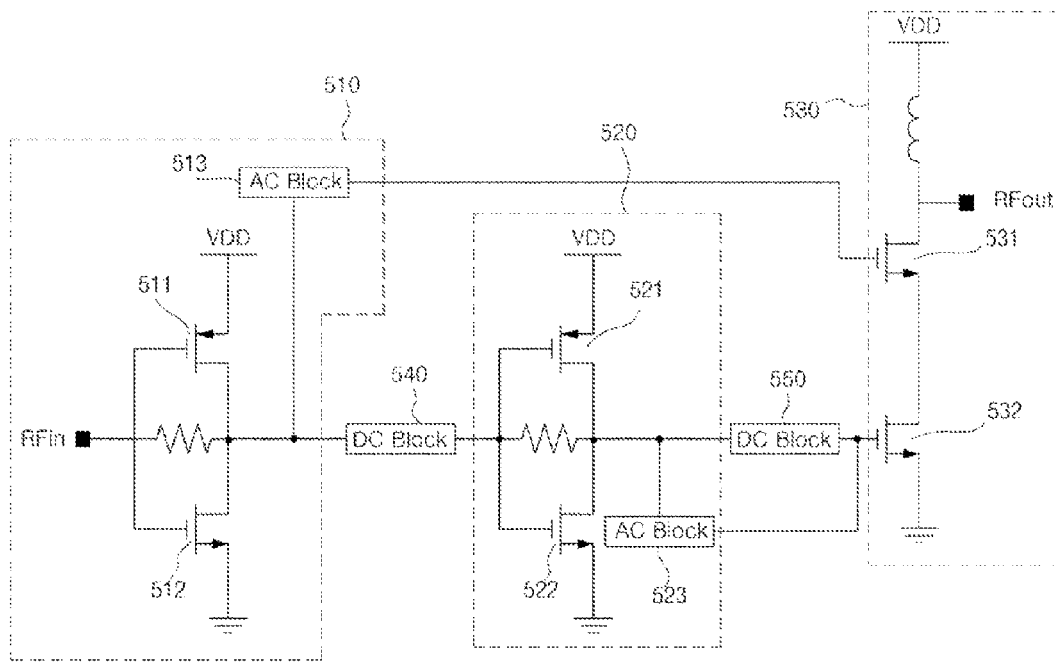
FIG. 5 illustrates a circuit diagram of another expanded exemplary embodiment of FIG. 3.

FIG. 5 illustrates a circuit diagram of another expanded exemplary embodiment of FIG. 3.

Referring to FIG. 5, inverter type power amplifiers 510 and 520 of total two stages and a typical power amplifier 530 of one stage are connected in series. DC blocking blocks 540 and 550 are connected between the inverter type power amplifiers 510 and 520 to separate the DC voltage of each stage. Here, the third stage of power amplifier 530 has a structure in which a common gate type of first transistor 531 and a common source type of second transistor 532 are connected in a cascade method.

In operation of the exemplary embodiment of FIG. 5, when a high signal is applied through the input port (RF$_{in}$) of the first stage of power amplifier 510, a first transistor 511 is turned off, a second transistor 512 is turned on, and thus a low signal is outputted from the output port.

DC and AC components are included in the outputted low signal. When the DC component of the outputted low signal is blocked by the DC blocking block 540 and only the AC component is applied to the input port the second stage of power amplifier 520, a first transistor 521 is turned on, a second transistor 522 is turned off, and thus a high signal is outputted from the output port.

Further, an AC component of the outputted high signal passing through the DC blocking block 550 is applied to a gate of a second transistor 532 included in the third stage of power amplifier 530. A DC component passing through an AC blocking block 523 is also applied to the gate of the second transistor 532. When the high signal is applied to the gate of the second transistor 532, the second transistor 532 is turned on.

In addition, when a DC voltage fixed by an AC blocking block 513 is applied to the gate of the first transistor 531, since a voltage difference between the gate and the source of the first transistor 531 due to a voltage drop is greater than a threshold value, the first transistor 531 is also turned on.

That is, while the DC voltage is applied to the gate of the first transistor 531 and the gate of the second transistor 532, the self-bias of the DC component outputted from the AC blocking block 513 is applied to the gate of the first transistor 531, and the self-bias of the DC component outputted from the AC blocking block 523 is applied to the gate of the transistor 532. Similar to the exemplary embodiment of FIG. 4, performance ratios between the first transistors 512 and 522 and the second transistors 513 and 523 of the inverter type power amplifiers 510 and 520 may be respectively adjusted for generating desired DC voltages.

Figure 6:
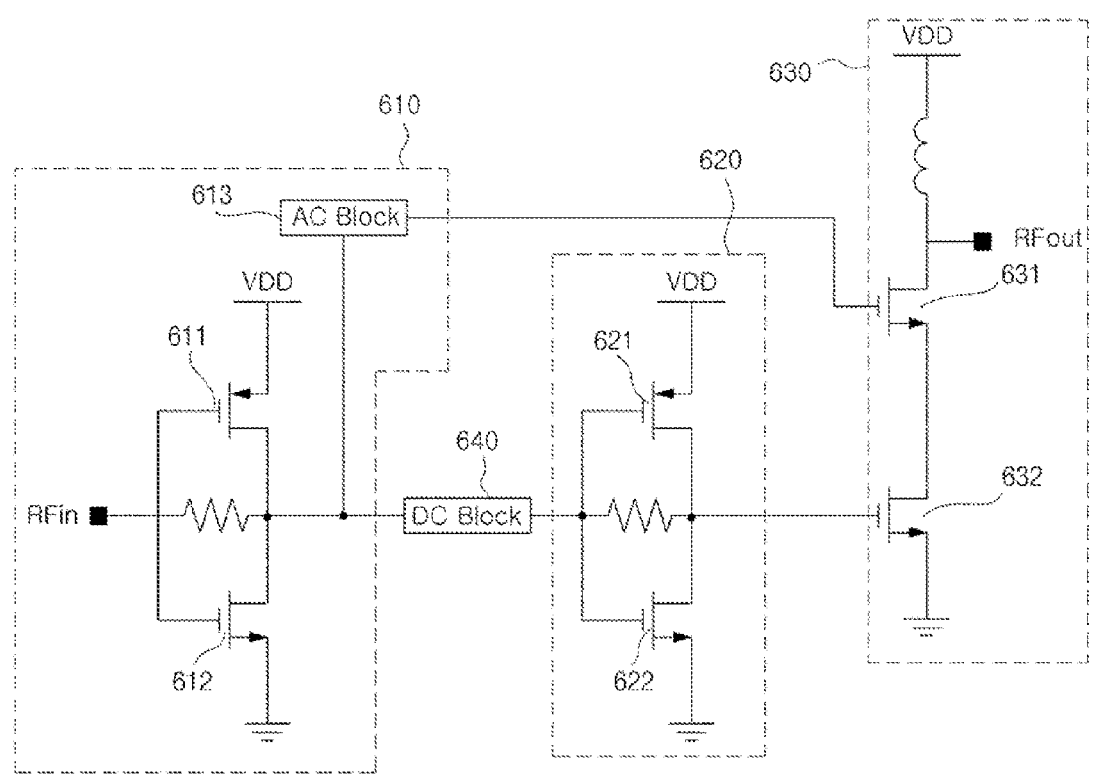
FIG. 6 illustrates a circuit diagram of a further another expanded exemplary embodiment of FIG. 3.

FIG. 6 illustrates a circuit diagram of a further another expanded exemplary embodiment of FIG. 3.

A circuit shown in FIG. 6 is one that the AC blocking block and the DC blocking block that are connected to the input port of the common source type of second transistor 632 of the power amplifier 630 disposed in the third stage are removed from the circuit shown in FIG. 5.

As such, according to the circuit shown in FIG. 6, switching operations of power amplifiers 610, 620, and 630 are the same as those of FIG. 5.

Particularly, FIG. 6 is characteristic in that all of a DC component and an AC component are applied to a gate of a second transistor 632 of the power amplifier 630 disposed in a third stage of FIG. 6.

Therefore, according to the exemplary embodiment of FIG. 6, the complexity thereof can be further reduced.

According to the exemplary embodiments of the present disclosure, the self-bias can be generated without any additional bias circuit, thereby simplifying the entire system. Further, since power consumed by the bias circuit decreases, energy efficiency of the entire system may increase.

The present disclosure has been described with reference to the exemplary embodiments. Those skilled in the art will appreciate that various modifications are possible without departing from the essential characteristic of the present disclosure. Accordingly, the disclosed exemplary embodiments need to be considered in an illustrative aspect, not a limiting aspect. Therefore, it shall be construed in such a manner that the scope of the present disclosure is not limited to the aforementioned exemplary embodiment, and includes the contents described in the accompanying claims and various implementations within the scope equivalent to the claims.

DESCRIPTION OF SYMBOLS 100, 200, 300, 410, 420, 430, 510, 520, 610, 620: inverter type power amplifier
530, 630: typical power amplifier
110, 210: PMOS,
120, 220: NMOS,
310, 411, 421, 431, 511, 521, 531, 611, 621, 631: first transistor,
320, 412, 422, 432, 512, 522, 532, 612, 622, 632: second transistor,
130, 330: feedback resistor,
231, 232, 440, 540, 550, 640: DC blocking block,
241, 242, 340, 413, 423, 513, 523, 613: AC blocking block,
251, 252: DC power source,
350: DC output port

What is claimed is:

1. An inverter type power amplifier comprising:
a first stage of power amplifier comprising a first transistor, a second transistor and a feedback resistor, wherein the feedback resistor comprises a first terminal connected to an input port and a second terminal connected to an output port;

a second stage of power amplifier comprising a first transistor, a second transistor and a feedback resistor, wherein the feedback resistor comprises a first terminal connected to an input port and a second terminal connected to an output port, and the second stage of power amplifier is connected to the first stage of power amplifier in series;

a third stage of power amplifier comprising a first transistor and a second transistor, wherein the third stage of power amplifier is connected to the second stage of power amplifier in series;

a first AC blocking block comprising a first terminal connected to the output port of the first stage of power amplifier and a second terminal connected to the first transistor of the third stage of power amplifier; and a second AC blocking block comprising a first terminal connected to the output port of the second stage of power amplifier and a second terminal connected to the second transistor of the third stage of power amplifier.

2. The inverter type power amplifier of claim 1, wherein the output port of the first stage of power amplifier is connected a DC blocking block.

3. The inverter type power amplifier of claim 1, wherein the second terminal of the first AC blocking block is connected to a gate of the first transistor of the third stage of power amplifier, and the second terminal of the second AC blocking block is connected to a gate of the second transistor of the third stage of power amplifier.

4. The inverter type power amplifier of claim 1, wherein the first AC blocking block or the second AC blocking block comprises a resistor.

5. The inverter type power amplifier of claim 1, wherein each of the first transistors of the first, second and third stage of power amplifier is a p-type MOSFET, each of the second transistors of the first, the second and the third stage of power amplifier is an n-type MOSFET, each of the first terminals of the first transistors and the second transistors is a source, and each of the second terminals of the first transistors and the second transistors is a drain.

6. The inverter type power amplifier of claim 1, wherein each of the first transistors of the first, second and third stage of power amplifier is a p-type MOSFET, each of the second transistors of the first, second and third stage of power amplifier is a n-type MOSFET, each of the first terminals of the first transistors and the second transistors is a source, and each of the second terminals of the first transistors and the second transistors is a drain.

7. An inverter type power amplifier comprising:

a first stage of power amplifier comprising a first transistor, a second transistor and a feedback resistor, wherein the feedback transistor comprises a first terminal connected to an input port and a second terminal connected to an output port;

a second stage of power amplifier comprising a first transistor, a second transistor and a feedback resistor, wherein the feedback resistor comprises a first terminal connected to an input port and a second terminal connected to an output port, and the second stage of power amplifier is connected to the first stage of power amplifier in series;

a third stage of power amplifier comprising a first transistor and a second transistor, wherein the third stage of power amplifier is connected to the second stage of power amplifier in series;

a first AC blocking block comprising a first terminal connected to the input port of the first stage of power amplifier and a second terminal connected to the first transistor of the third stage of power amplifier; and a second AC blocking block comprising a first terminal connected to the input port of the second stage of power amplifier and a second terminal connected to the second transistor of the third stage of power amplifier.

8. The inverter type power amplifier of claim 7, wherein the output port of the first stage of power amplifier is connected a DC blocking block.

9. The inverter type power amplifier of claim 7, wherein the second terminal of the first AC blocking block is connected to a gate of the first transistor of the third stage of power amplifier, and the second terminal of the second AC blocking block is connected to a gate of the second transistor of the third stage of power amplifier.

10. The inverter type power amplifier of claim 7, wherein the first AC blocking block or the second AC blocking block comprises a resistor.

11. The inverter type power amplifier of claim 7, wherein each of the first transistors of the first, second and third stage of power amplifier is a p-type MOSFET, each of the second transistors of the first, second and third stage of power amplifier is a n-type MOSFET, each of the first terminals of the first transistors and the second transistors is a source, and each of the second terminals of the first transistors and the second transistors is a drain.

12. The inverter type power amplifier of claim 7, wherein each of the first transistors of the first, second and third stage of power amplifier is a PNP-type BJT, each of the second transistors of the first, second and third stage of power amplifier is a NPN-type BJT, each of the first terminals of the first transistors and the second transistors is an emitter, and each of the second terminals of the first transistors and the second transistors is a collector.

13. An inverter type power amplifier comprising:

a first transistor including a gate to which an AC type of input signal is applied through an input port, a first terminal of the first transistor connected a power source voltage, and a second terminal of the first transistor connected to a first output port;

a second transistor including a gate through which the input signal is applied thereto, a first terminal of the second transistor connected to a ground, and a second terminal of the second transistor connected to the first output port;

a feedback resistor including a first terminal connected to the input port and a second terminal connected to the first output port; and an AC blocking block including a first terminal and a second terminal, the first terminal of the AC blocking block connected to the first output port and the second terminal of the AC blocking block connected to a second output port, wherein the AC blocking block blocks alternating current (AC) applied to the gate of the first transistor through the input port and only direct current (DC) is outputted to the second output port without additional bias circuit.

* * * * *